United States Patent [19]
Lee et al.

[11] Patent Number: 6,063,692
[45] Date of Patent: May 16, 2000

[54] OXIDATION BARRIER COMPOSED OF A SILICIDE ALLOY FOR A THIN FILM AND METHOD OF CONSTRUCTION

[75] Inventors: Wei William Lee, Plano; Joseph D. Luttmer, Richardson; Hong Yang, Dallas, all of Tex.

[73] Assignee: Texas Instruments Incorporated, Dallas, Tex.

[21] Appl. No.: 09/211,454

[22] Filed: Dec. 14, 1998

[51] Int. Cl.[7] .......................................................... G02F 1/17

[52] U.S. Cl. .......................... 438/431; 438/433; 438/473; 438/580; 438/581; 438/582; 438/583; 438/595; 438/767; 438/768; 438/783; 438/785

[58] Field of Search ..................................... 438/431, 433, 438/473, 580, 581–583, 595, 767, 768, 783, 785

[56] References Cited

U.S. PATENT DOCUMENTS

| | | | |
|---|---|---|---|
| 4,433,901 | 2/1984 | Takahashi et al. | 350/357 |
| 5,286,336 | 2/1994 | Chan et al. | 156/643 |

*Primary Examiner*—Fetsum Abraham
*Attorney, Agent, or Firm*—Mark A. Valetti; Carlton H. Hoel; Richard L. Donaldson

[57] ABSTRACT

A method of fabricating an oxidation barrier for a thin film is provided. The method may include forming a thin film (10) outwardly from a semiconductor substrate (12) and separated from the semiconductor substrate (12) by a primary insulator layer (14). A reactive layer (16) may be formed in-situ adjacent to the thin film (10). An oxidation barrier (20) may be formed by a chemical reaction between the thin film (10) and the reactive layer (16). The oxidation barrier (20) may comprise a silicide alloy that operates to reduce oxidation of the thin film (10).

15 Claims, 4 Drawing Sheets

OXIDATION BARRIER COMPOSED OF A SILICIDE ALLOY FOR A THIN FILM AND METHOD OF CONSTRUCTION

TECHNICAL FIELD OF THE INVENTION

This invention relates generally to the field of semiconductor devices, and more particularly to an oxidation barrier for thin films and method of construction.

BACKGROUND OF THE INVENTION

Electronic equipment such as televisions, telephones, radios, and computers are constructed using semiconductor components such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductive, semiconductive, or insulation regions formed on the semiconductor substrate.

In order to decrease the size, or linewidth, of the microelectronic device, the size and thickness of conductive, semiconductive, and insulation regions forming each microelectronic device must be reduced. As the linewidth of the microelectronic device is scaled down into the deca-nano range (<0.1 micron), thin films are often used to form the microelectronic device. These thin films generally have a thickness of less than 1,000 Å. The micro-thickness of the thin film makes the thin film susceptible to significant oxidation damage. The thin film is particularly susceptible to oxidation damage during subsequent fabrication processes that include temperature cycles that are above 350 degrees Centigrade.

One such microelectronic device that may utilize a thin film is a transistor, such as a gallium arsenide metal-semiconductor field effect transistor (MESFET), a heterostructure field effect transistor (HFET), or the like. Transistors having a linewidth in the deca-nano range often utilize thin films in the fabrication of a gate for the transistor. The thin film gate is formed on the semiconductor substrate and operates to control the flow of current through the transistor. Oxidation damage to the thin gate transistor reduces the performance of the gate. In some cases, the entire micro-thickness of the thin film gate can be destroyed by oxidization, making the transistor inoperable.

SUMMARY OF THE INVENTION

Accordingly, a need has arisen for an oxidation barrier for thin films. The present invention provides an oxidation barrier for thin films that substantially eliminates or reduces problems associated with the prior methods and systems.

In accordance with one embodiment of the present invention, a method of forming an oxidation barrier for a thin film comprises forming the thin film outwardly from a semiconductor substrate and separated from the semiconductor substrate by a primary insulator layer. A reactive layer is in-situ formed adjacent to the thin film. An oxidation barrier is then formed by a chemical reaction between the thin film and the reactive layer. The oxidation barrier comprises a silicide alloy that operates to reduce oxidation of the thin film.

Important technical advantages of the present invention includes providing a protective surface on the thin film that reduces or prevents oxidation of the underlying thin film during subsequent fabrication operations.

Another technical advantage of the present invention is that the silicide alloy comprising the oxidation barrier forms a salicidized region within the thin film. The salicidized region reduces the electrical contact resistance between the thin film and a conductive contact that is formed in subsequent fabrication processes.

Other technical advantages will be readily apparent to one skilled in the art from the following figures, description, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

FIGS. 1A through 1D illustrate the fabrication of an oxidation barrier for thin films. As described in more detail below, the oxidation barrier for thin films may be formed by in-situ depositing a reactive layer adjacent the thin film to form a silicide layer within the thin film. A blocking layer may then be deposited outwardly from the silicide layer to further form the oxidation barrier. The oxidation barrier prevents the oxidation of the thin film and also provides a salicidized surface. Salicidation is the process of forming a self-aligned region comprising a conductive silicide material. This region is useful, for example, in reducing the electrical contact resistance between conductive contacts.

Figure 1A:
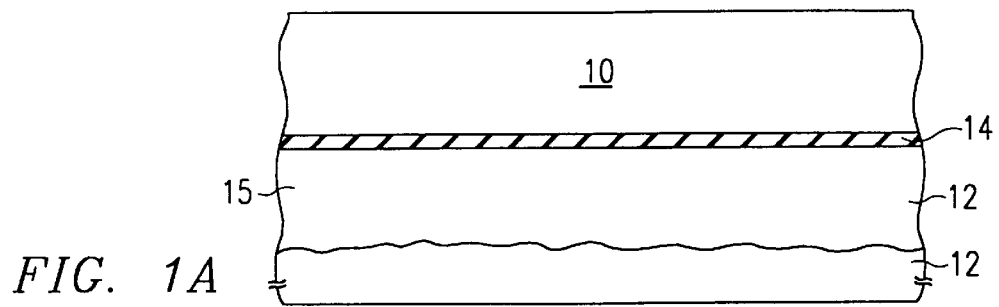
FIGS. 1A through 1D are a series of schematic cross-sectional diagrams illustrating the fabrication of an oxidation barrier for a thin film in accordance with the present invention.

FIG. 1A illustrates a thin film 10, for example a layer of tungsten, separated from a semiconductor substrate 12 by a primary insulation layer 14. In one embodiment, the semiconductor substrate 12 comprises a wafer formed from a single-crystalline silicon material. It will be understood that the substrate 12 may comprise other suitable materials or layers without departing from the scope of the present invention. For example, the substrate 12 may include an epitaxial layer, a recrystallized semiconductor material, a polycrystalline semiconductor material, or other suitable semiconductor material.

The substrate 12 is doped to form a well region 15. The well region 15 comprises a portion of the substrate 12 into which impurities have been introduced to form a semiconductive region. The well region 15 of the substrate 12 may be doped with p-type or n-type impurities to change the operating characteristics of a microelectronic device (not shown) formed on the doped substrate 12. In one embodiment, the well region 15 is doped with gallium arsenide. It will be understood that the well region 15 may be otherwise doped without departing from the scope of the present invention.

The primary insulation layer 14 operates to electrically isolate the thin film 10 from the substrate 12. The thickness of the primary insulation layer 14 may be on the order of 20 to 50 Å. In one embodiment, the primary insulation layer 14 comprises silicon dioxide grown on a surface of the substrate 12. It will be understood that the primary insulation layer 14 may comprise other materials suitable for insulating semiconductor elements. For example, the primary insulation layer 14 may comprise silicon nitride grown on the surface of the substrate 12.

As will be discussed in greater detail below, the material comprising the thin film 10 must be capable of forming a silicide alloy. In one embodiment, the thin film 10 comprises tungsten. It will be understood that the thin film 10 may comprise other suitable silicide forming materials without departing from the scope of the present invention. For example, the thin film 10 may comprise titanium, tantalum, cobalt, nickel, platinum, or other suitable silicide forming materials.

The thin film 10 is deposited using conventional fabrication techniques, such as Plasma Enhanced Chemical Vapor Deposition (PECVD), Thermal Low Pressure Vapor Deposition (TLPVD), Physical Vapor Deposition, (PVD), or other such suitable fabrication technique. The thickness of the thin film 10 is generally on the order of 400 to 1,000 Å. The thickness of the thin film 10 may be substantially greater to allow an outside surface of the thin film 10 to oxidize and form a surface oxide (not shown).

Figure 1B:
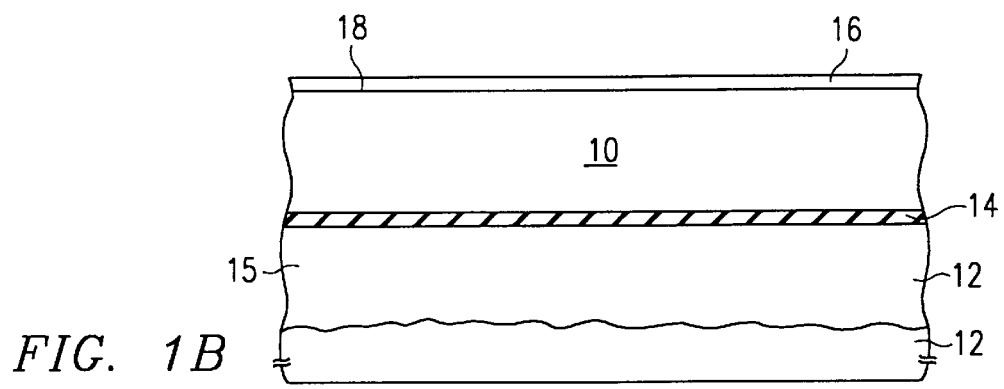

Referring to FIG. 1B, a first reactive layer 16 is in-situ deposited onto an outer surface 18 of the thin film 10. The thickness of the first reactive layer 16 may be on the order of 10 to 30 Å. As will be discussed in greater detail below, the material forming the first reactive layer 16 must be capable of reacting with the material forming the thin film 10 to form a silicide alloy. In one embodiment, the first reactive layer 16 comprises amorphous or polycrystalline silicon. It will be understood that the first reactive layer 16 may comprise other suitable silicide forming materials without departing from the scope of the present invention.

The first reactive layer 16 must be in-situ deposited on a clean surface of the thin film 10. In one embodiment, the first reactive layer 16 is deposited in a chamber having the capability of removing a surface oxide (not shown) from the thin film 10 before in-situ depositing the first reactive layer 16 onto the outer surface 18 of the thin film 10. For example, the chamber may be a single reactor, a multiple reactor cluster tool, or other such suitable chamber. In an embodiment in which the thin film 10 comprises tungsten, the surface oxide may be removed from the outer surface 18 of the thin film 10 by argon sputtering. In another embodiment, the first reactive layer 16 is in-situ deposited in the same chamber that the thin film 10 is in-situ deposited. Such a chamber is used in applications including Plasma Enhanced Chemical Vapor Deposition (PECVD), Thermal Low Pressure Vapor Deposition (TLPVD), and Physical Vapor Deposition (PVD), as discussed above.

Figure 1C:
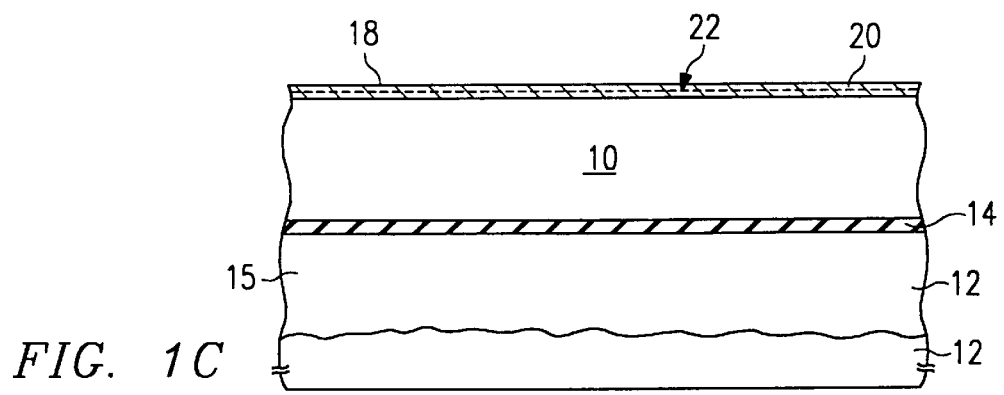

Referring to FIG. 1C, an oxidation barrier 20 is formed in the outer surface 18 of the thin film 10 by a chemical reaction between the thin film 10 and the first reactive layer 16. The chemical reaction generally occurs during the in-situ deposition of the first reactive layer 16 onto the outer surface 18 of the thin film 10 and consumes the first reactive layer 16 entirely. The pre-chemical reaction boundary between the first reactive layer 16 and the thin film 10 is shown generally by reference number 22. The oxidation barrier 20 comprises a silicide alloy. The particular type of silicide alloy is dependent upon the materials comprising the first reactive layer 16 and the thin film 10. For example, if the thin film 10 comprises tungsten, titanium, or platinum, and the first reactive layer 16 comprises polysilicon, the silicide alloy forming the oxidation barrier 20 comprises tungsten silicide, titanium silicide, or platinum silicide, respectively. It will be understood that the oxidation barrier 20 may comprise other suitable silicide alloy materials without departing from the scope of the present invention. For example, the oxidation barrier 20 may comprise such silicide alloys as cobalt silicide, nickel silicide, tantalum silicide, or other suitable silicide alloys.

The silicide alloy comprising the oxidation barrier 20 has a higher chemical stability than the material comprising the thin film 10. Thus, the silicide alloy resists oxidation and forms a diffusion barrier against oxidation of the thin film 10 in later fabrication processes. In addition, the silicide alloy comprising the oxidation barrier 20 provides the added benefit of forming a salicidized region within the thin film 10. The salicidized region reduces the electrical contact resistance between the thin film 10 and a conductive contact (not shown) that may be formed in subsequent fabrication processes.

Figure 1D:
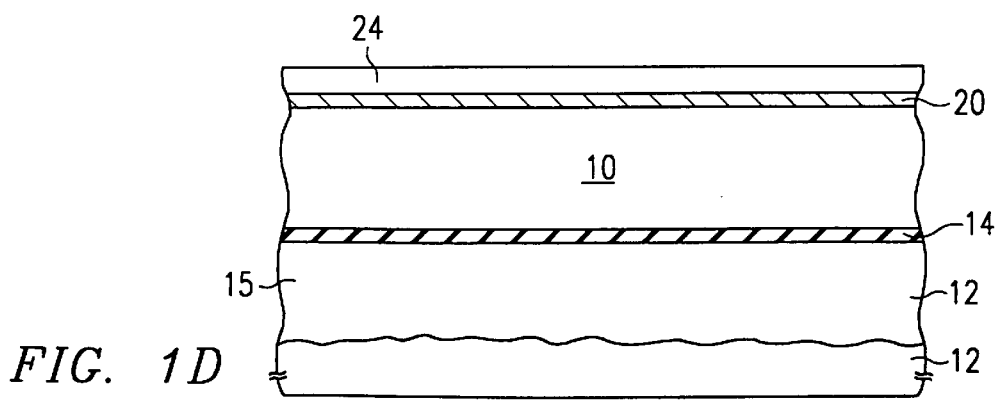

Referring to FIG. 1D, an optional blocking layer 24 is formed outwardly from the oxidation barrier 20. The blocking layer 24 is generally deposited by Chemical Vapor Deposition (CVD) techniques or Physical Vapor Deposition (PVD) techniques such as sputtering. The thickness of the blocking layer 24 is generally greater than 100 Å. The blocking layer 24 operates as an additional barrier to the oxidation of the thin film 10. As will be described in greater detail below, the blocking layer 24 generally comprises the same dielectric material used to form a spacer body (not shown) for fabrication of a self-aligned source transistor (not shown). In one embodiment, the blocking layer 24 comprises silicon dioxide. It will be understood that the blocking layer 24 may comprise other suitable materials without departing from the scope of the present invention. For example, the blocking layer 24 may comprise silicon nitride, oxynitride alloys, or other suitable materials.

Figure 2A:
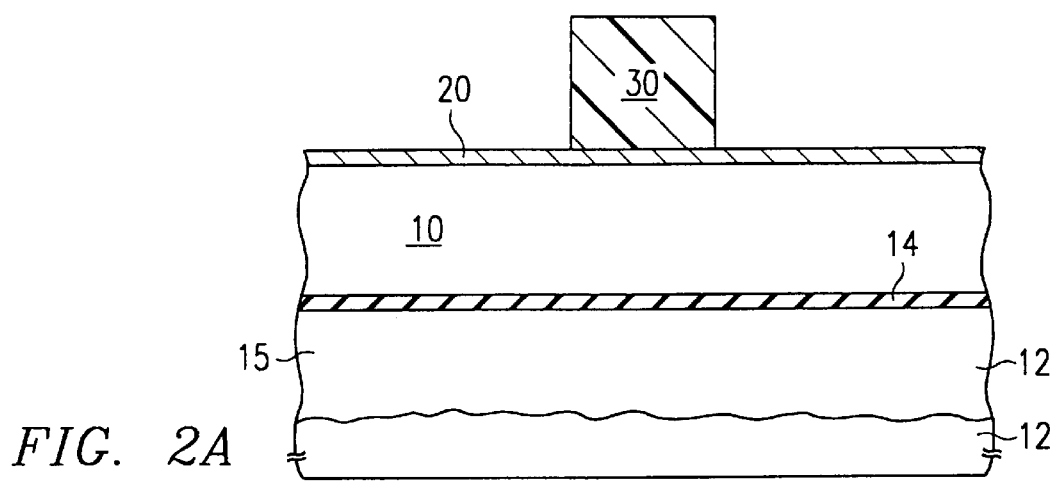
FIGS. 2A through 2G are a series of schematic cross-sectional diagrams illustrating the fabrication of an oxidation barrier in a gate of a thin film transistor in accordance with the present invention.

FIGS. 2A through 2G illustrate the fabrication of a thin gate transistor using the thin film of FIGS. 1A through 1E. Referring to FIG. 2A, a photoresist mask 30 is formed outwardly from the oxidation barrier 20 of the thin film 10. The photoresist mask 30 exposes a portion of the underlying material. The photoresist mask 30 is fabricated by conventional photolithography techniques. One such photolithography technique for fabricating the photoresist mask 30 includes applying a layer of photoresist material (not shown) outward of an underlying material, such as the oxidation barrier 20. The photoresist material comprises a material that cures in response to electromagnetic radiation, such as light. Electromagnetic radiation is focused through a mask pattern (not shown) onto the layer of photoresist material. The mask pattern blocks a portion of the electromagnetic energy such that the electromagnetic radiation striking the layer of photoresist material is in a pattern. The photoresist material cures in a pattern corresponding to the pattern of electromagnetic energy striking the layer of photoresist material. The non-cured portions of the photoresist material are then removed to form the photoresist mask 30. It will be understood that the photoresist mask 30 may be formed outwardly from the blocking layer 24 without departing from the scope of the present invention.

Figure 2B:
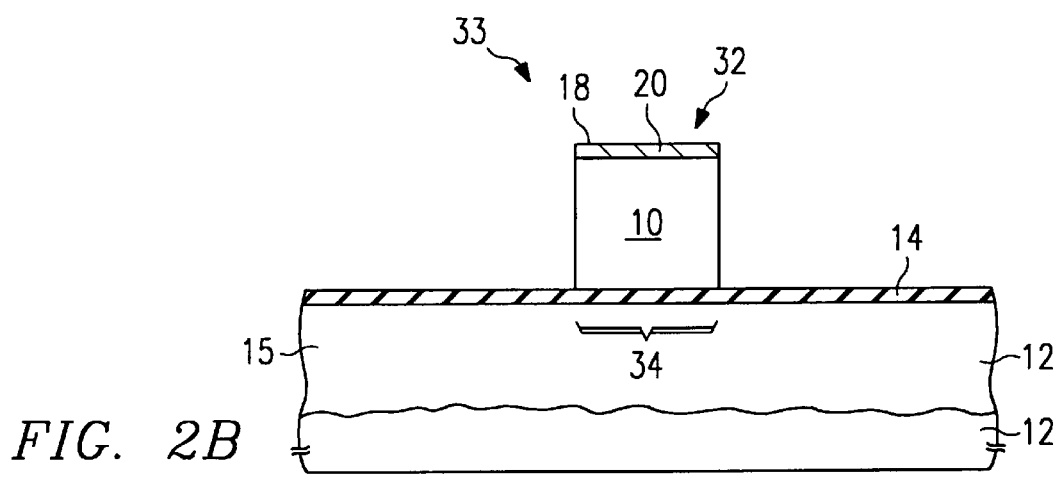

Referring to FIG. 2B, the exposed portions of the thin film 10, including the oxidation barrier 20, are anisotropically etched to form a gate 32 of a thin film transistor 33. Anisotropic etching may be accomplished with a plasma-based Reactive Ion Etch (REI) process using fluorine-based gases such as $NF_3$. The gate 32 defines a channel region 34 of the semiconductor substrate 12. The width and thickness of the gate 32 are typically on the order of 500 to 1,000 Å and 400 to 1,000 Å, respectively. The remaining portions of the photoresist mask 30 are removed to expose the underlying material.

Figure 2C:
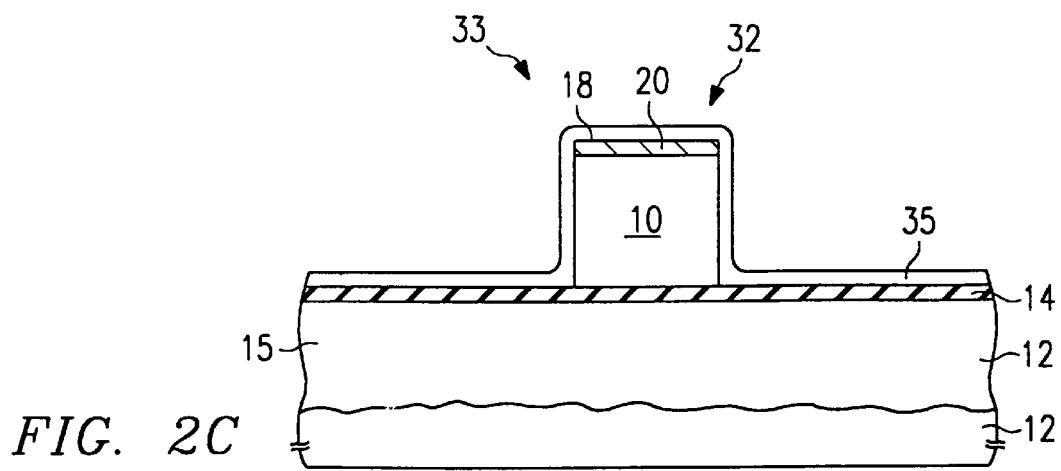

Referring to FIG. 2C, an optional second reactive layer 35 is in-situ deposited outwardly from the gate 32. The material forming the second reactive layer 35 must be capable of reacting with the material forming the thin film 10 to form a silicide alloy. The thickness and the material comprising the second reactive layer 35 are the same as previously discussed in reference to the first reactive layer 16.

Figure 2D:
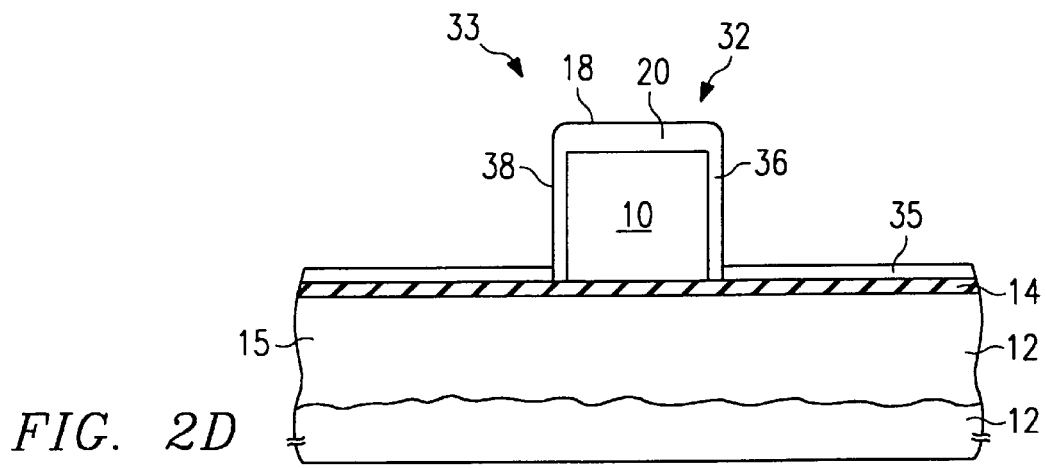

Referring to FIG. 2D, an optional sidewall surface oxidation barrier 36 is formed on a sidewall surface 38 of the gate 32 by a chemical reaction between the material comprising the thin film 10 and the material comprising the second reactive layer 35. The sidewall surface oxidation barrier 36 is formed in the same manner as previously described in reference to the formation of the oxidation barrier 20. The sidewall surface oxidation barrier 36 comprises a silicide alloy as previously described in reference to the oxidation barrier 20.

Figure 2E:
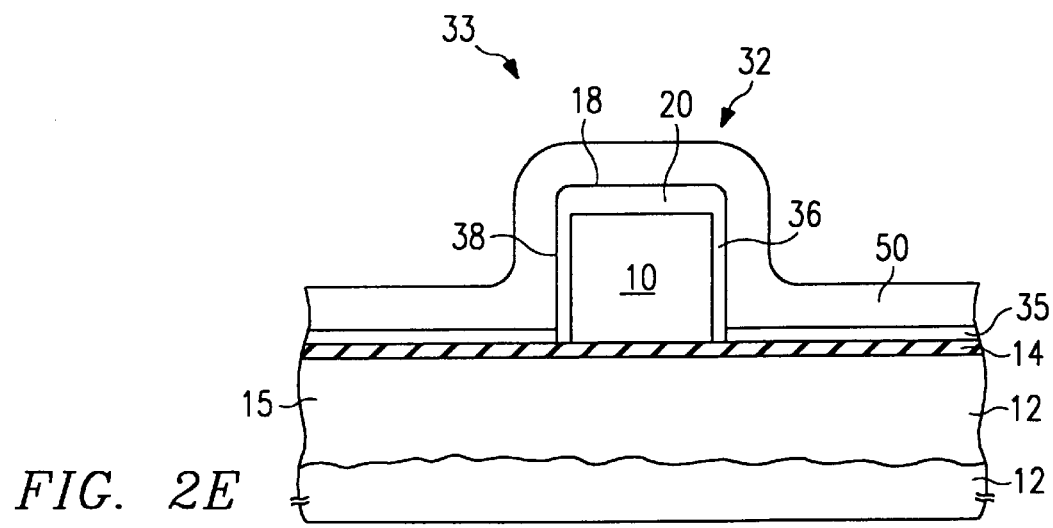

Referring to FIG. 2E, a spacer layer 50 is formed outwardly from the gate 32 and the substrate 12. The spacer layer 50 is deposited using conventional fabrication techniques, such as Chemical Vapor Deposition (CVD), Physical Vapor Deposition (PVD), or other such suitable fabrication technique. The thickness of the spacer layer 50 is generally on the order of 500 Å. In one embodiment, the spacer layer 50 comprises silicon dioxide. It will be understood that the spacer layer 50 may comprise other suitable dielectric materials or layers without departing from the scope of the present invention. For example, the spacer layer 50 may comprise silicon nitride, oxynitride, or other suitable dielectric material.

In an embodiment in which the spacer layer 50 is in-situ deposited after fabrication of the gate 32 by an anisotropic etching process, the sidewall surface oxidation barrier 36 is not required. In this embodiment, the spacer layer 50 adequately protects the thin film 10, which forms the gate 32, from oxidation.

Figure 2F:
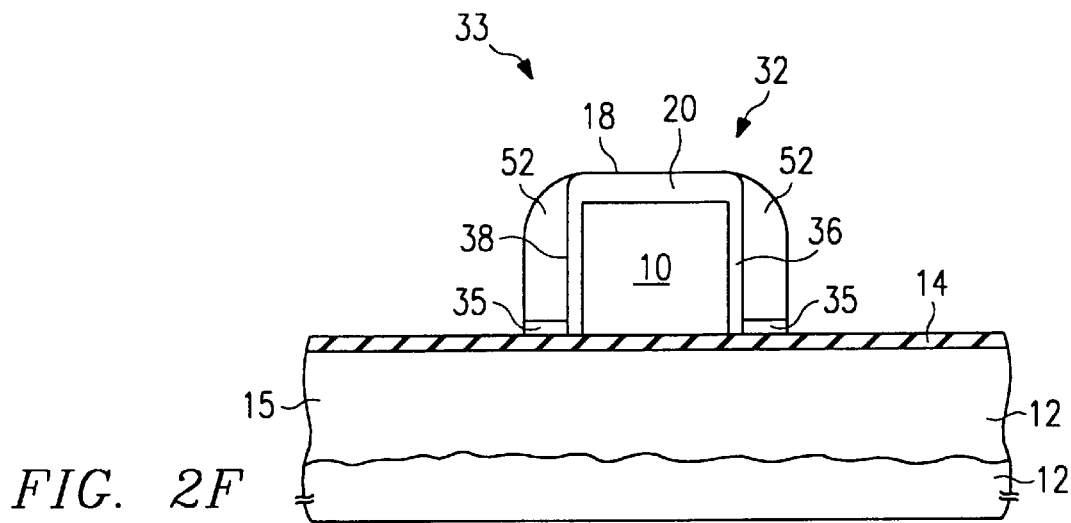

Referring to FIG. 2F, the spacer layer 50 is then anisotropically etched to form a spacer 52 adjacent to the sidewall surface 38 of the gate 32. The anisotropic etching process also exposes a portion of the substrate 12. Anisotropic etching of the spacer layer 50 may be accomplished using a plasma-based Reactive Ion Etch (RIE) process using carbon fluorine-based gases such as $CF_4$ and or $CHF_3$. The spacer 52 operates to electrically isolate the gate 32 from other elements of the thin film transistor 33 and may provide the spacing for forming self-aligned source and drain regions in the transistor. It will be understood that the spacer 52 may be otherwise fabricated without departing from the scope of the present invention.

Figure 2G:
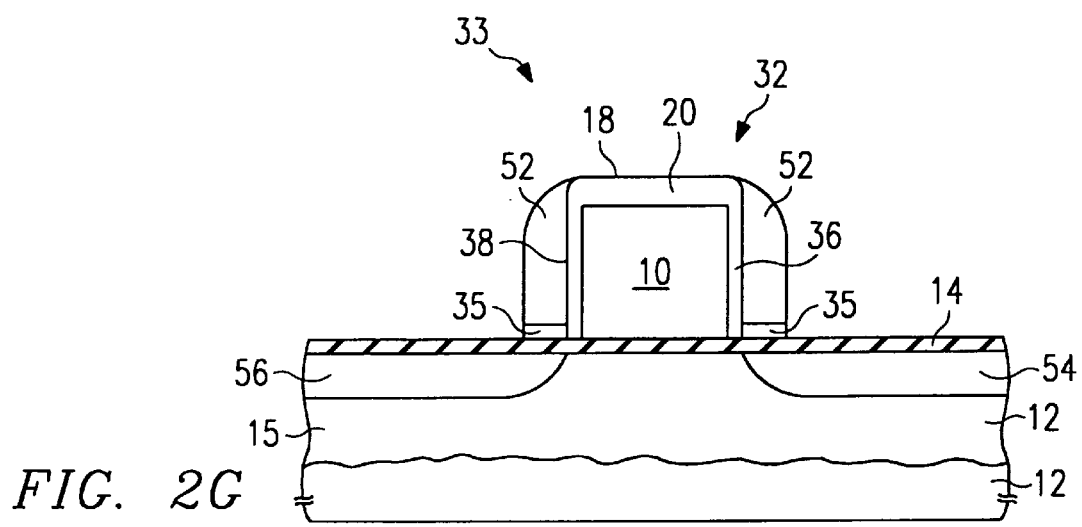

Referring to FIG. 2G, the exposed substrate 12 is then implanted with a dopant (not shown) to form a first conductive region (not shown) and a second conductive region (not shown). The substrate 12 is thermally treated to diffuse the dopant into the substrate 12. Diffusion of the first conductive region into the substrate 12 under the spacer 52 forms a source region 54 of the thin film transistor 33. Diffusion of the second conductive region under the spacer 52 forms a drain region 56 of the thin film transistor 33. The thermal treatment for diffusing the dopant into the substrate 12 may include a Rapid Thermal Annealing (RTA) process or heating in a conventional furnace. The thermal treatment process for diffusing the dopant into the substrate 12 may be varied in both temperature and duration to vary the size of the source and drain regions 54 and 56, respectively. In addition, the size of the source and drain regions 54 and 56 may be changed by varying the depth and concentration that the dopant implanted into the substrate 12. It will be understood that the source and drain regions 54 and 56, respectively, of the thin film transistor 33 may be fabricated by other processes without departing from the scope of the present invention. For example, the source and drain regions 54 and 56, respectively, may be formed by a process that includes diffusion of the dopant from a dopant layer.

Although the present invention has been described with several embodiments, various changes and modifications may be suggested to one skilled in the art. It is intended that the present invention encompass such changes and modifications that follow within the scope of the appended claims.

What is claimed is:

1. A method of forming an oxidation barrier for a thin film, the method comprising:

forming the thin film outwardly from a semiconductor substrate and separated from semiconductor substrate by a primary insulator layer;

in-situ forming a reactive layer outwardly from the thin film; and chemically reacting the reactive layer with an outer surface of the thin film to form an oxidation barrier, the oxidation barrier comprising a silicide alloy.

2. The method of claim 1, and further comprising the step of doping the semiconductor substrate to form a well region.

3. The method of claim 2, wherein the dopant used to form the well region comprises gallium arsenide.

4. The method of claim 1, wherein the thin film comprises tungsten.

5. The method of claim 1, wherein the reactive layer comprises silicon.

6. The method of claim 1, and further comprising the step of forming a blocking layer outwardly from the oxidation barrier.

7. The method of claim 1, and further comprising the step of removing a surface oxidation from the thin film prior to the step of in-situ depositing a reactive layer.

8. The method of claim 1, and further comprising the steps of:

forming a photoresist mask outwardly from the oxidation barrier, the photoresist mask exposing a portion of the oxidation barrier;

anisotropically etching the exposed portions of the oxidation barrier to expose a portion of the thin film;

anisotropically etching the exposed portions of the thin film to expose a portion of the primary insulation layer;

wherein the remaining portions of the thin film and the oxidation barrier form a gate of a thin film transistor.

9. The method of claim 8, further comprising the steps of:

forming a spacer layer outwardly from the gate and the semiconductor substrate;

anisotropically etching the spacer layer to form a spacer adjacent a sidewall surface of the gate, and exposing a portion of the semiconductor substrate;

implanting a dopant into the exposed portion of the semiconductor substrate; and thermally treating the semiconductor substrate to diffuse the dopant and form a source and drain region of the thin film transistor.

10. The method of claim 9, wherein the spacer layer comprises silicon dioxide.

11. A method of forming a thin film transistor comprising the steps of:

forming a gate of the thin film transistor outwardly from a semiconductor substrate and separated from the semiconductor substrate by a primary insulation layer, the gate including an oxidation barrier on an outer surface of the gate, the oxidation barrier comprising a silicide alloy;

forming a spacer adjacent a sidewall surface of the gate and exposing a portion of the semiconductor substrate;

irradiating the exposed portion of the semiconductor substrate with a dopant to form conductive regions within the semiconductor substrate; and diffusing the dopant within the conductive regions to form a source region and a drain region of the thin film transistor.

12. The method of claim 11, wherein the silicide alloy comprises tungsten silicide.

13. The method of claim 11, wherein the step of forming a gate comprises forming a gate of the thin film transistor outwardly from the semiconductor substrate and separated from the semiconductor substrate by a primary insulation layer, the gate including an oxidation barrier and a sidewall surface oxidation barrier, the oxidation barrier and the sidewall surface oxidation barrier comprising a silicide alloy.

14. The method of claim 11, wherein the semiconductor substrate includes an well region doped with gallium arsenide.

15. The method of claim 11, wherein the step of forming a gate comprises the following steps:

forming a thin film outwardly from the semiconductor substrate and separated from semiconductor substrate by a primary insulator layer;

in-situ forming a reactive layer adjacent to the thin film; and forming an oxidation barrier within the thin film by a chemical reaction between the thin film and the reactive layer, the oxidation barrier comprising a silicide alloy that operates to reduce oxidation of the thin film;

forming a photoresist mask outwardly from the thin film, the photoresist mask exposing a portion of the thin film; and anisotropically etching the exposed portions of the thin film to expose a portion of the primary insulation layer, the remaining portions of the thin film forming the gate of the thin film transistor.

* * * * *